United States Patent [19]

Norsworthy et al.

[11] Patent Number: 5,276,856
[45] Date of Patent: Jan. 4, 1994

[54] MEMORY CONTROLLER FLEXIBLE TIMING CONTROL SYSTEM AND METHOD

[75] Inventors: John P. Norsworthy, Carrollton; David T. Stoner, McKinney; Michael K. Corry, Plano, all of Tex.

[73] Assignee: Pixel Semiconductor, Inc., Plano, Tex.

[21] Appl. No.: 414,106

[22] Filed: Sep. 28, 1989

[51] Int. Cl.⁵ .............. G06F 1/06; G06F 1/08; G11C 8/00
[52] U.S. Cl. .................... 395/550; 395/165; 395/425; 365/230.09; 365/233
[58] Field of Search .................... 364/200, 521; 365/230.09, 189.02, 233

[56] References Cited

U.S. PATENT DOCUMENTS

| | | | |
|---|---|---|---|
| 4,219,880 | 8/1980 | Nichols | 364/718 |
| 4,295,194 | 10/1981 | Darden et al. | 364/200 |
| 4,509,120 | 4/1985 | Daudelin | 364/200 |
| 4,575,815 | 3/1986 | Delahunt | 395/550 |
| 4,701,843 | 10/1987 | Cohen | 364/200 |
| 4,785,428 | 11/1988 | Bajwa et al. | 365/189.02 |
| 4,825,416 | 4/1989 | Tam et al. | 365/189.02 |
| 4,839,856 | 6/1989 | Tanaka | 364/900 |
| 4,847,758 | 7/1989 | Olson et al. | 364/200 |
| 4,899,312 | 2/1990 | Sato | 365/230.09 |
| 4,933,910 | 6/1990 | Olson et al. | 365/238.5 |
| 4,985,848 | 1/1991 | Pfeiffer et al. | 364/521 |
| 5,034,917 | 7/1991 | Bland et al. | 364/900 |

Primary Examiner—Eugene R. LaRoche
Assistant Examiner—Michael C. Kessell
Attorney, Agent, or Firm—Baker & Botts

[57] ABSTRACT

There is disclosed a system and method of controlling the timing in a system having a number of different elements, each requiring individual timing signals. The system utilizes a RAM memory divided into a number of groups or cycle types, each cycle type having a number of addressable words. The individual bits of each word serve to control the individual system elements. The memory is programmed to allow each group of words to control the system timing in a different manner. Provision is made for the memory to skip certain words in a particular group under control of externally provided signals.

7 Claims, 3 Drawing Sheets

MEMORY CONTROLLER FLEXIBLE TIMING CONTROL SYSTEM AND METHOD

TECHNICAL FIELD OF THE INVENTION

This invention relates to a system and method for controlling the timing of a processing system, and more particularly to such a system where the timing commands are programmable.

BACKGROUND OF THE INVENTION

The rapid change in technology, especially memory and processing technology, is at times overwhelming. For leading edge systems, such as, for example, imaging systems, it is mandatory that the latest technology be used if a competitive product is to be marketed and maintained. As technology changes, the speed of operation changes and this change affects every aspect of a system, from memory access control to data processing.

The backbone of any complex system is the system clock and the timing pulses derived therefrom which control the various system elements. These pulses are akin to a conductor keeping all the parts in line and all the data moving in synchronization with each other. Thus, when it is desired to add a new faster memory, or CPU or adder, a different set of clock pulses may be required giving rise to a different set of timing patterns for control purposes.

Under this situation, the system designer would have to establish a new clock, or run new wires, or in some manner change the system to accommodate the new device. This is cumbersome at best and time consuming. In addition, because of the integrated nature of circuit boards, the process is expensive to implement. Changing older versions to newer versions is also difficult.

Thus, a need exists in the art for a system which allows for timing changes to be made in a system easily and without requiring extensive wiring or other mechanical manipulations to the system hardware.

SUMMARY OF THE INVENTION

These and other problems have been solved by our flexible timing system in which a random access memory (RAM) is used to control the timing signals in an imaging system. In one embodiment, there are twenty (0-19) timing signals each controlled by a bit in a word of a RAM. The twenty signals constitute one sub-cycle and there are a maximum of sixteen sub-cycles in a full memory cycle.

The RAM has twenty output leads, each capable of controlling any device, or device input, in the system. The memory has a clock which controls address sequencing. The memory is loaded with 20-bit words, and each bit of a word controls a particular one of the twenty signals in a sub-cycle. The number of words in a memory partition, or block, determines the length of the cycle in terms of sub-cycles.

Since the master clock pulse controls memory access, it is possible to arrange the memory access such that certain sub-cycles are skipped, thereby allowing faster memory access under certain conditions. For example, in a DRAM or VRAM the same leads are used for providing row and column timing information to the memory. The timing pulses control whether row data is present or whether column data is present. Often it will happen that the same row is used for many columns of data. In this situation it is advantageous not to go through the row sub-cycle each time since the row has already been selected by the previous access. When such a situation is detected, the system is arranged to skip over some words in the provided block of words, thereby skipping the row address timing control. In this manner time can be saved in accessing memory data. For large data volumes, such as typically utilized in imaging systems, this time savings can be significant.

Accordingly, it is a feature of this invention that a timing memory is established having a number of addressable and sequencable words, the bits of which are used to control system timing.

It is a further feature of this invention that the words are arranged into groups according to the type of timing sequence desired. Bits within the group can control the skipping of words within the group thereby modifying the timing sequence.

BRIEF DESCRIPTION OF THE DRAWINGS

Further aspects of the invention and their advantages will be discerned by reference to the following detailed description in conjunction with the appended drawings, in which.

DETAILED DESCRIPTION OF INVENTION

Figure 1:
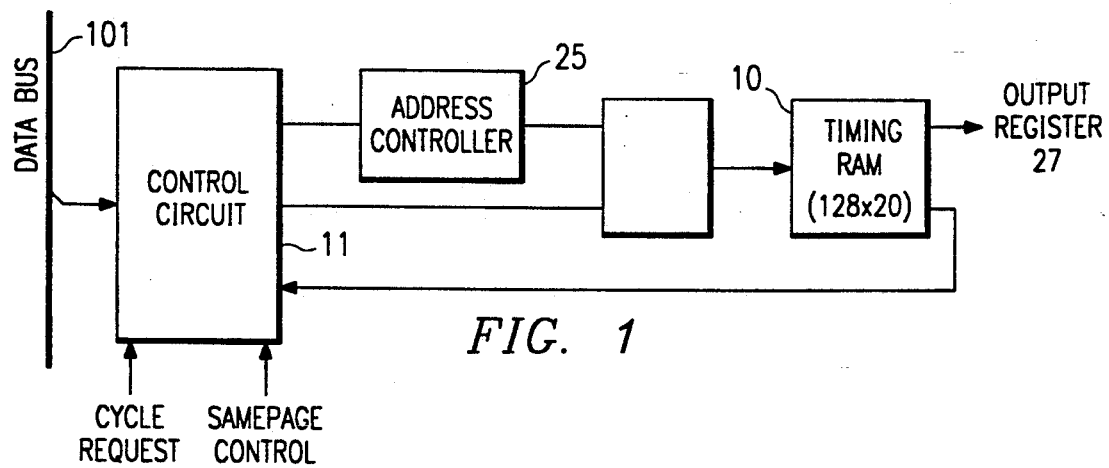
FIG. 1 shows a schematic view of the overall timing control system.

Turning now to FIG. 1, there is shown timing RAM 10 controlled by control circuit 11 and address counter 25. Control circuit 11 receives data over data bus 101 from the processor. This information, which is typically received upon initialization of the system, contains data bits that go into timing RAM 10 to control the various timing phases. Once this information is loaded it can be changed from time to time, but typically it remains static. The circuitry within control circuit 11 is operative to establish, in the manner to be seen, addresses within timing RAM 10 for the start of a sequence of timing pulses based upon certain parameters. Address counter 25 operates to control the sequencing through timing RAM 10 depending upon the start address. The SAME PAGE control signal is used to bypass certain pulse subcycles from timing RAM 10 whenever the same row is to be accessed during consecutive cycles.

CYCLE REQUEST is a request signal that can come from various different types of processors, each having different cycle timing requirements. Depending upon the type of cycle request received, the timing RAM will start at a different base memory position, and will continue under control of address counter 25 to step sequentially through its address block until a bit within the memory stops the sequencing for that cycle. Thus, different cycles can have a different number of steps, or subcycles, all controlled internally and all changeable upon initialization of information in timing RAM 10 as obtained over data bus 101.

Figure 2:
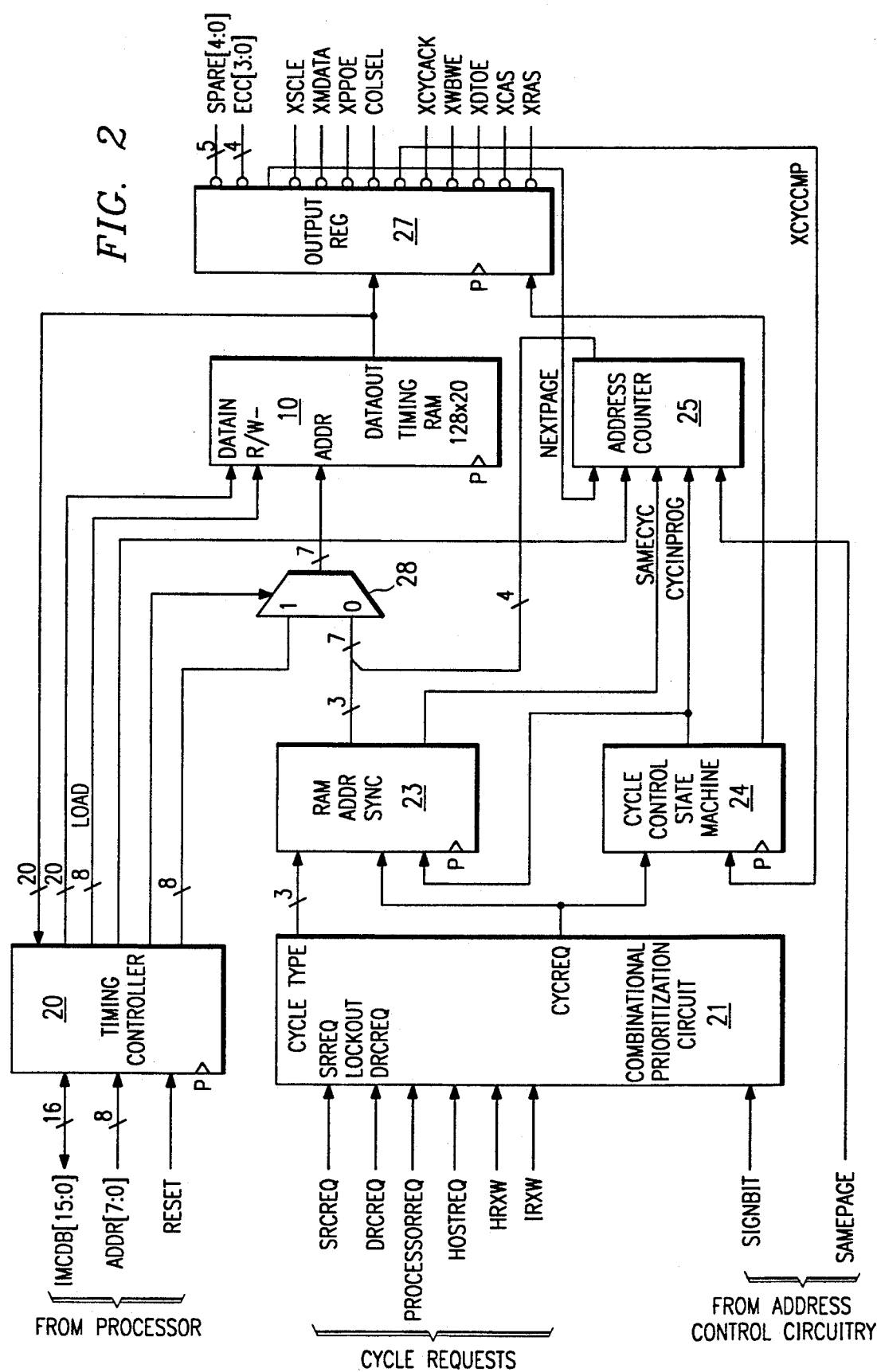
FIG. 2 is a detailed schematic of the system operation.

Turning now to FIG. 2, before launching into a full explanation of the operation of the circuitry of FIG. 2, it will be helpful to understand what the major components do within the system. Timing controller 20 provides the system interface to timing RAM 10 and also maintains the counter load value for counterjump locations in address counter 25. Combinational prioritization circuit 21 arbitrates between different types of memory requests. RAM address sync 23 provides a latch to hold the current cycle type information. Cycle control state machine 24 generates cycle control for memory cycles. Address multiplexer 28 multiplexes between the addresses from RAM address sync 23 and address counter 25 or the initialization addresses from timing controller 20. Address counter 25 generates sequential addresses for indexing timing RAM 10. Output register 27 provides cleaner signals having superior timing characteristics because it removes pulse edge instability associated with RAM data access.

Timing RAM 10, in this embodiment, is divided into eight sections of sixteen locations (addresses) each, for a total of 128 words of memory. Each of the eight sections handles the timing control bits for a different cycle type. Thus, there are eight cycle types in the system. The cycle types are as follows: Screen refresh; DRAM refresh; host access read; host access write; two cycles for processor first memory access (read/write); and two cycles for processor second memory access (read/write).

There are seven bits of address for 128 locations of memory. The top three address bits determine the cycle types, while the lower four bits of address come from address counter 25. This arrangement can be seen in FIG. 3, which is a timing RAM memory map. The cycle type shown in the far left column makes up one upper three bits 301 of the address. The full address is made up from cycle type 301 and the four lower bits 302 which come from address counter 25. A combination of bits 301 and 302 point to a data word in memory, such as, for example, data word A. Within any one cycle type there will be several data words arranged in address sequence as shown by lines A through C.

In the embodiment, there is a maximum of 16 possible data words (or subcycles) for each cycle type. However, as will be seen, all 16 do not have to be used in any cycle type. The number of subcycles is controlled by one of the bits, for example, bit 19, such that when a 1 appears in the 19th position, the system stops cycling through the sequence. Thus, if we had, for example, a two data line cycle (shown in lines E and F), a 1 would appear in the second line (F) and would stop the cycling at that point.

For convenience and ease of design the beginning address location for any cycle has the lowest four bits 0000. This then allows address counter 25 to provide the four lower control bits. This is accomplished by first setting address counter 25 to 0000 and supplying those four bits, together with the three upper bits from circuit 21, via multiplexer 28, to the memory. For any given cycle, the upper three bits will typically remain constant while address counter 25 cycles sequentially through its possible sixteen addresses from 0000 to 1111. As will be seen, it is possible to jump ahead and skip some addresses and the actual end of the sequence is controlled by a flag bit in one of the subcycle words.

Figure 3:
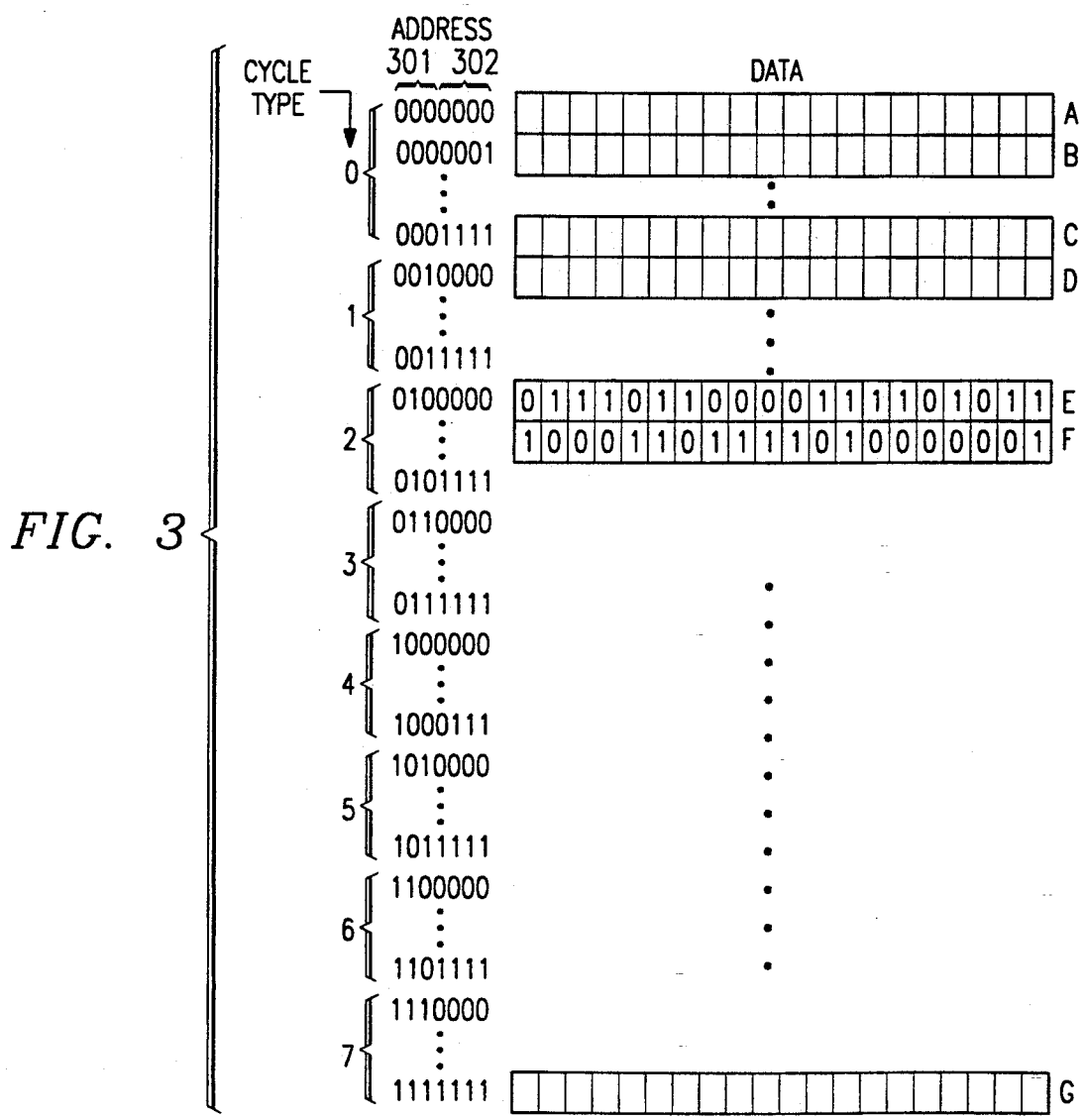
FIG. 3 is an example of a timing RAM memory map.
Figure 4:
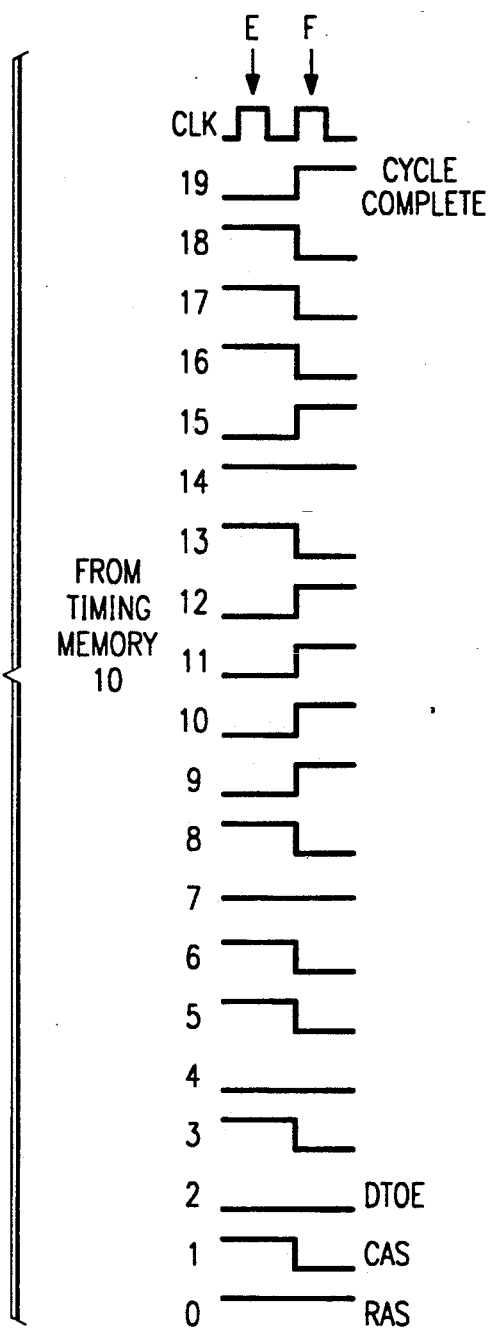
FIG. 4 is a timing chart for one of the cycles shown in FIG. 3.

Before returning to FIG. 2, perhaps it will be well to review FIG. 4 in conjunction with FIG. 3 and assume that cycle two (lines E and F) has been selected. Remember, of course, that the bits within these two lines are arbitrary for this example.

Line E of FIG. 3 would produce the signals shown in FIG. 4 for each of the bits 0 through 19 under the notation E. Note that bit 19 in line E is a 0, and, as discussed, it is bit 19 that will determine when the cycle is complete. Thus, if the cycle had several subcycles within it, line 19 would stay 0, or low, until the completion of the last cycle. Since our example is a two-step cycle, line 19 will go high in the second cycle (F) as shown.

Each of the bits, 0 through 19 from memory 10, is connected to a particular physical location in the system. For example, bit 0 is connected to control the RAS control of memory, while bit 1 is connected to the CAS memory control. Any number of subcycles (words) within the cycle can be attributed to any one of the positions. Thus, by changing the cycle type it is possible to change the number of 0's or 1's, and thus more or less time could be provided to a particular lead.

For example, lead DTOE is connected to lead (BIT) 2. The signal on lead DTOE, when cycle two is selected, is low for both subcycles. However, in another cycle lead DTOE could be high for one or both (or all) of the subcycles by changing the bit in bit position 2 of the addressed word.

Returning now to FIG. 2, let us now examine the circuitry which controls timing RAM 10 to perform the functions just described. An example of a memory cycle could be that combinational prioritization circuit 21 receives a cycle request from the processor via one of the processor request lines. Prioritization circuit 21 then generates a cycle type which is held by RAM address sync circuit 23. That cycle type, as previously discussed, translates directly to the upper three bits of the memory address for that particular type of cycle. The lower four bits of memory, as previously discussed, come from address counter 25 starting at 0000 for the start of the sequence. RAM address sync circuit 23 holds the cycle type for the duration of a cycle, while the address counter sequences from 0 up to a possible 15, causing timing RAM 10 to output its data in sequential order, as previously discussed with respect to FIGS. 3 and 4. Bit 19 in our example from timing RAM 10 feeds back to timing controller 20 which, in turn, causes address counter 25 to stop sequencing prior to reaching the 16th address location within the cycle. When the cycle ends, RAM address sync circuit 23 releases the cycle type and waits for another cycle type.

In dynamic memory operations it is typical to address the row and column separately. This operation is controlled by a RAS (row address strobe) signal and a CAS (column address strobe) signal. Often however, the information which is to be read out of, or written to, a memory is in the same row as just addressed but at a different column address. In those situations time could be saved by eliminating the need for continuously providing RAS signals when the RAS address would be the same. This is typically referred to as page mode addressing. Consequently, in this situation if circuitry recognizes that the next address is in the same row as the previous address, a SAME PAGE signal is provided from the address control circuitry. The SAME PAGE signal then causes address counter 25 to skip to a subsequent subcycle which eliminates the operation of the RAS signal, and provides only CAS signals. In this way, certain subcycles of the selected cycle are eliminated under control of the SAME PAGE signal. the above described address control circuitry is shown in detail in concurrently filed co-pending Patent Application entitled "Image Memory Controller and Method of Operation" Ser. No. 07/414,139 which is hereby incorporated by reference.

While the operation just described is simple to describe, there are many factors which must be taken into account before timing steps can be skipped. One obvious one is the fact that the same cycle type must be involved in both accesses because it would not make sense to skip a row access on one cycle if a different cycle is being executed. Also, it should be noted that a bit in timing RAM 10 is dedicated to controlling when, in fact, the actual skipping will occur, if at all. Thus when a 1 appears in that bit position, the system looks to see if a skip indication is pending in the register. If so, the skip is executed. The skip can be for a fixed number of subcycles or could be a variable number.

While the skip function has been described with respect to the memory cycle, this same feature is available for any type of cycle since the skip function is controlled by a combination of bits within timing RAM 10 in conjunction with externally provided triggers. Also, note that it is possible from time to time to change a cycle either permanently or temporarily, either by reloading into timing RAM 10 on a dynamic basis new bit information for a cycle or by providing a special register which can be accessed under certain conditions to provide specific timing outside of timing RAM 10. While in typical operations, timing RAM 10 is operating at a cycle rate much faster than the cycle rate of the processor, any updates or changes from the processor to the timing RAM would have to be done, for example, between cycles, or via a buffer memory operating at a higher speed than a typical processor.

Also note that the timing circuit described herein can handle several different memory types. For example, memories of 64K bits of address space and memories of 1 megabit of address space may operate on different cycles. Thus, some indication must be provided as to which memory or which cycle should be provided to the memory for a given address. This is controlled by the SIGN bit lead which comes from the aforementioned Address Control Circuitry.

What is claimed is:

1. A timing control system for use in a processing system, which has a plurality of clock controlled circuits each having a clock input, said system comprising:
  a memory having words comprising n bits each;
  means for associating individual bits of said words with a particular one of said clock inputs so that, for a particular selected word, the actual bit stored at a location will provide an "on" or "off" signal to said associated clock input;
  means for arranging a plurality of said words into a memory block, said memory block for associated with said clock controlled circuits and a plurality of other memory blocks;
  means for selecting a particular memory block from a plurality of said memory blocks;
  means associated with said memory and said arranging means for sequencing through the words of a selected one of said memory blocks thereby allowing the output bits from said selected words to control said clock controlled circuits and bypass certain ones of said words whenever said sequencing means repetitively sequences through said certain ones of said words;
  means for selecting a different memory block during said sequence in response to a request from the processing system, said means for selecting a particular memory block including means for generating a particular address of said memory based upon received requests from said processing system, said sequencing means including a counter for generating a first address within said selected memory block and for advancing from said generated address one address location at a time; and
  means for dynamically modifying the count of said counter thereby modifying the timing sequence of said system.

2. The timing system of claim 1 wherein said dynamically modifying means is controlled jointly by an externally provided signal and by bits within a selected memory block.

3. A timing control system for use in a processing system, which has a plurality of clock controlled circuits each having a clock input, said system comprising:
  a memory having words comprising n bits each;
  means for associating individual bits of said words with a particular one of said clock inputs so that, for a particular selected word, the actual bit stored at a location will provide an "on" or "off" signal to said associated clock input;
  means for arranging a plurality of said words into a memory block, said memory block for associated with said clock controlled circuits and a plurality of other memory blocks, said arranging means uses bits from certain ones of said memory words;
  means for selecting a particular memory block from a plurality of said memory blocks;
  means associated with said memory and said arranging means for sequencing through the words of a selected one of said memory blocks thereby allowing the output bits from said selected words to control said clock controlled circuits and bypass certain ones of said words whenever said sequencing means repetitively sequences through said certain ones of said words; and
  means for selecting a different memory block during said sequence in response to a request from the processing system.

4. An arrangement for controlling system component timing, said arrangement comprising:
  a timing control memory, said timing control memory having selectable words each having a plurality of bits for controlling individual ones of said system components such that during a first period of time an enable signal is provided for row addressing of a component memory controlled by at least one bit of a first word of said timing memory and contains, during a second period of time, an enable signal for column addressing of said component memory controlled by at least one other bit of said first word of said timing control memory;
  means for accepting a signal indicating when a row address is the same in a next subsequent address;
  means for sequencing through a group of said timing control memory words to control said row and column address presentation to said component memory and bypass certain ones of said words whenever said sequencing means repetitively sequences through said certain ones of said words; and
  means controlled by said accepting means and associated with said timing control memory for inhibiting certain ones of said words of a selected group of said selected timing control memory words while still providing other words of said group, said sequencing means including a counter for advancing from a first selected word of said group one address location at a time, said inhibiting means including means for dynamically modifying the count of said counter thereby modifying the timing sequence of said system components.

5. A method for controlling system timing in a processing system having a plurality of clock controlled circuits each having a clock input, said method comprising the steps of:

associating the clock controlled circuits with a timing memory, said timing memory having words comprising n bits each, individual bits of said words each being associated with a particular one of said clock inputs so that the actual bit stored at a location will provide an "on" or an "off" signal to said associated clock input;

arranging a plurality of said words into a plurality of memory blocks;

selecting a particular one of said memory blocks;

sequencing through the words of a selected one of said memory blocks to allow the output bits from said selected words to control said clock controlled circuits and to bypass certain ones of said words whenever said sequencing step sequences repetitively through said certain ones of said words;

selecting a different memory block during said sequencing step in response to a request from the processor system, said selecting step including the step of generating a particular address of said memory based upon received requests from said processing system, said sequencing step including the steps of generating a first address within said selected memory block and advancing from said generated address one address location at a time; and dynamically modifying said advancing step thereby modifying the timing sequence of said system.

6. The method of claim 5 wherein said dynamically modifying step is controlled jointly by an externally provided signal and by a predetermined set of bits of each of said words within a selected memory block.

7. A method for controlling system component timing, said method comprising the steps of:

establishing a timing control memory, said memory having selectable words each having a plurality of bits for controlling individual ones of said system components, such that during a first period of time an enable signal is provided for row addressing of a memory controlled by at least one bit of a first word of said timing memory and contains, during a second period of time, an enable signal for column addressing of said memory controlled by at least one other bit of said timing memory;

accepting a signal indicating when a row address is the same in a next subsequent address;

sequencing through a group of said timing memory words, thereby producing a sequence of signals to control said row and column address presentation to said memory and to bypass certain ones of said words whenever sequencing repetitively through said certain ones of said words; and inhibiting, under control of said accepting step, certain of said words of a selected group of said selected timing memory words while still providing other words of said group, said sequencing step including the step of advancing from a first selected word of said group one address location at a time, and said inhibiting step including the step of dynamically modifying said advancing thereby modifying the timing sequence of said system components.

* * * * *